United States Patent
Kozawa (10) Patent No.: US 7,196,547 B2
(45) Date of Patent: Mar. 27, 2007

(54) LEVEL SHIFTER AND BUFFER CIRCUIT

(75) Inventor: Yukio Kozawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 104 days.

(21) Appl. No.: 11/142,259

(22) Filed: Jun. 2, 2005

(65) Prior Publication Data
US 2005/0270066 A1    Dec. 8, 2005

(30) Foreign Application Priority Data
Jun. 8, 2004    (JP) ............................. 2004-170310

(51) Int. Cl.
*H03K 19/0175* (2006.01)
(52) U.S. Cl. .............................. 326/81; 326/68; 326/80
(58) Field of Classification Search ............ 326/56–58, 326/63, 68, 80–81; 327/333
See application file for complete search history.

(56) References Cited

U.S. PATENT DOCUMENTS

2003/0179032 A1*  9/2003  Kaneko et al. ............. 327/333
2004/0169542 A1*  9/2004  Kouzuma .................... 327/333

FOREIGN PATENT DOCUMENTS

JP    2001-144600 A    5/2001

* cited by examiner

*Primary Examiner*—Anh Q. Tran
(74) *Attorney, Agent, or Firm*—Sughrue Mion, PLLC

(57) ABSTRACT

A level shifter has a voltage converting circuit converting an input signal provided by a first power supply into an output signal provided by a second power supply, and a reset circuit outputting a reset signal when the first power supply is turned off. The voltage converting circuit has: first and second FETs which are cross-coupled; a first trigger FET connected to the second FET and triggering it in response to the input signal; a second trigger FET connected to the second FET in parallel with the first trigger FET; a third trigger FET connected to the first FET and triggering it in response to an inversion signal of the input signal; and a fourth trigger FET connected to the first FET in parallel with the third trigger FET. Any of the second and the fourth trigger FETs triggers corresponding one of the second FET and the first FET in response to the reset signal.

17 Claims, 9 Drawing Sheets

| VDD2 | VDD3 | D_In | D_En | D_Out |
|---|---|---|---|---|
| ON | ON | 0 | 0 | Hi-Z |
| | | 1 | 0 | Hi-Z |
| | | 0 | 1 | 0 |
| | | 1 | 1 | 1 |
| OFF | ON | X | X | 1 |

LEVEL SHIFTER AND BUFFER CIRCUIT

BACKGROUND OF THE INVENTION

1. Field of the Invention

The present invention relates to a semiconductor integrated circuit having a multiple power supply. In particular, the present invention relates to a level shifter for converting a signal depending on a power supply into a signal depending on another power supply, and a buffer circuit including the level shifter.

2. Description of the Related Art

In a semiconductor integrated circuit, particularly, in an LSI (Large Scale Integrated circuit), a power supply voltage provided for internal circuits has been progressively reduced to lower level, because of a drop in a surge voltage capacity associated with an advancement in a high integrated fine process and a requirement for reducing an electric power consumption. On the other hand, a signal voltage level of an external input-output terminal of the LSI connected to an external device depends on characteristics of the external device and includes a variety of levels. Therefore, it is necessary in the LSI to provide another power supply voltage different from the power supply voltage for the inner circuits.

As a result, a plurality of power supply voltages are provided in one LSI chip. Thus, a circuit unit known as a "level shifter" is necessary for interfacing a power supply region with another power supply region on the LSI chip. The level shifter converts a signal level of a signal in the LSI chip.

Figure 1:
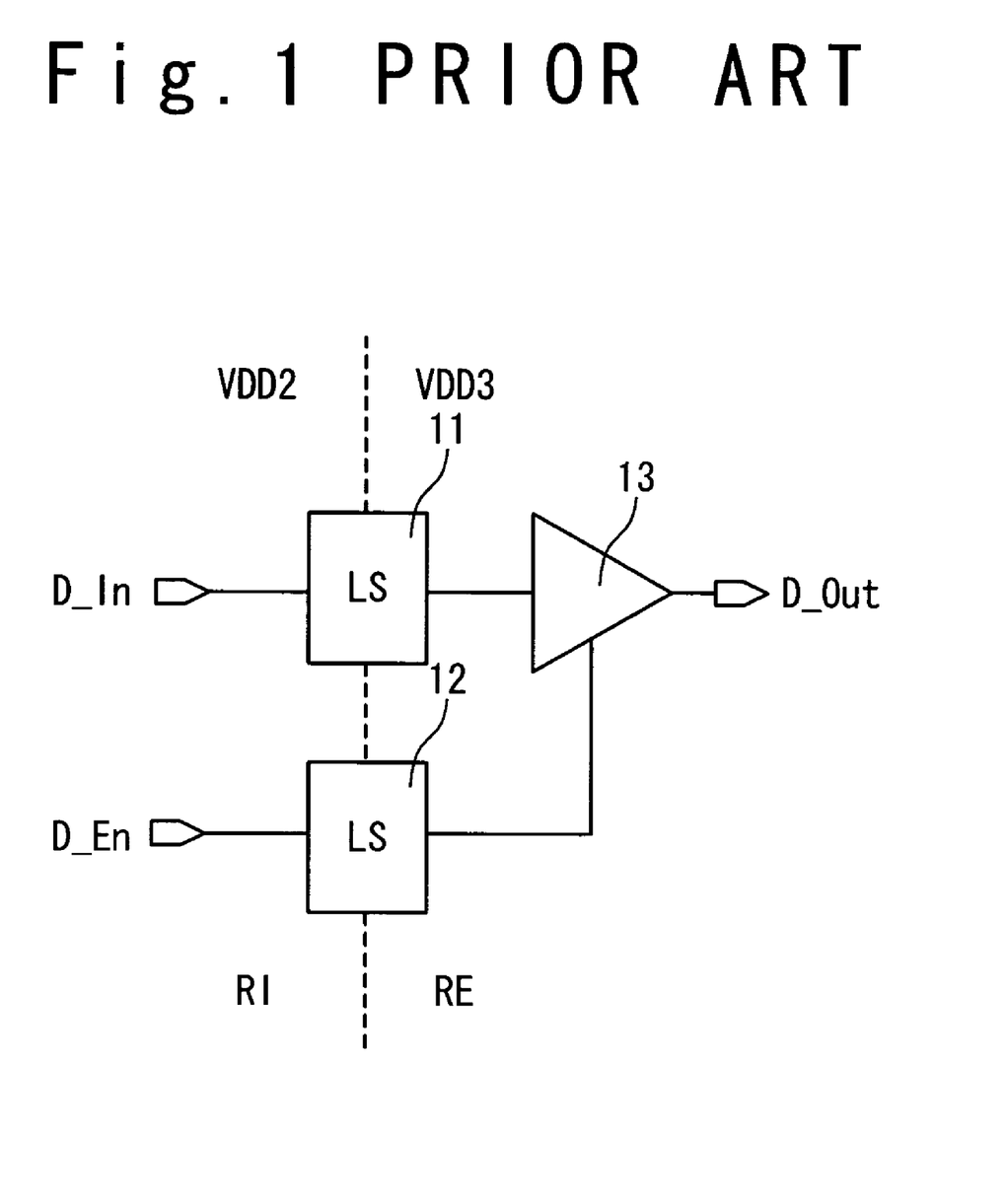
FIG. 1 is a circuit block diagram showing an output buffer including level shifters and a tri state buffer according to a conventional technique.

FIG. 1 is a circuit block diagram showing an output buffer including level shifters (LS) and a tri state buffer. A region RI corresponds to an LSI internal region to which a low power supply voltage VDD2 is provided, while a region RE corresponds to an LSI external interface region to which a high power supply voltage VDD3 is provided. The low power supply voltage VDD2 is an internal voltage and is supplied to internal circuits. On the other hand, the high power supply voltage VDD3 is an external interface voltage and is supplied to external interface circuits. For example, the low power supply voltage VDD2 is 2.5 V, and the high power supply voltage VDD3 is 3.3 V which is higher than the low power supply voltage VDD2.

The output buffer has a first level shifter 11, a second level shifter 12, and a tri state buffer 13. The tri state buffer 13 is provided in the region RE. The first level shifter 11 receives a data signal from a data input terminal D_in. The first level shifter 11 converts a signal level of the received data signal, and then outputs the level-shifted data signal to the tri state buffer 13. For example, the first level shifter 11 converts a high-level data signal of 2.5 V in the region RI into a high-level data signal of 3.3 V in the region RE. The second level shifter 12 receives an enable signal from an enable control input terminal D_En. The second level shifter 12 converts a signal level of the received enable signal, and then outputs the level-shifted enable signal to the tri state buffer 13. The enable signal is a signal for enabling the tri state buffer 13. An output of the tri state buffer 13 is dependent on the data signal and the enable signal. That is, the output status of the tri state buffer 13 becomes any of High, Low, and High Impedance in accordance with the data signal and the enable signal.

Figure 2:
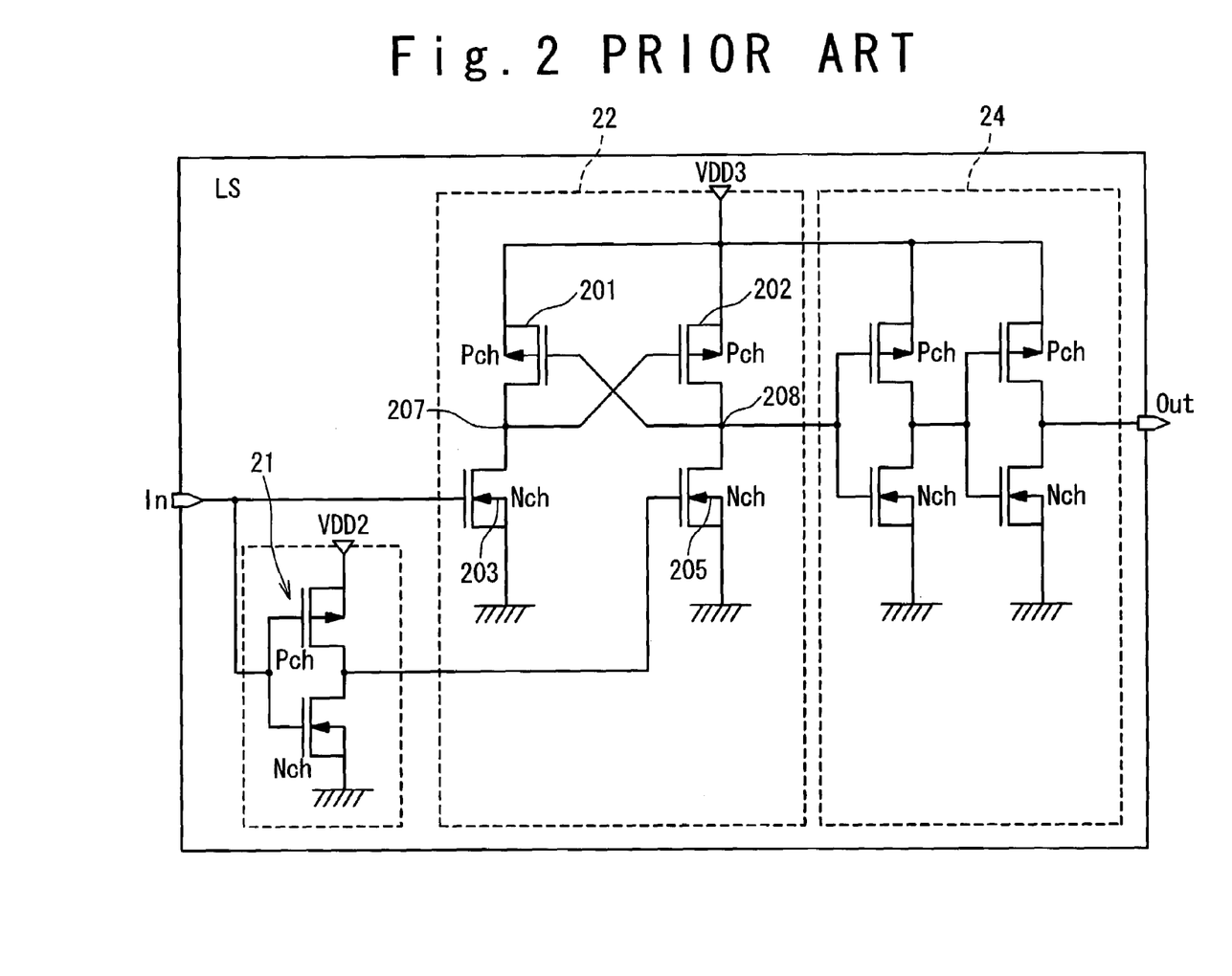
FIG. 2 is a circuit diagram showing a configuration of a level shifter according to a conventional technique.

Each of the first level shifter 11 and the second level shifter 12 has the same configuration. FIG. 2 is a circuit diagram showing the configuration of the level shifter according to the conventional technique. As shown in FIG. 2, the level shifter (LS) has an inverter 21, a voltage converting circuit 22, and a buffer 24.

The inverter 21 is connected to an input terminal In of the level shifter. The low power supply voltage VDD2 is supplied from a first power supply to the inverter 21. The inverter 21 has a P-channel transistor and a N-channel transistor which are connected in series between the power supply VDD2 and the ground. The inverter 21 receives an input signal from the input terminal In, and inverts the input signal to generate an inversion signal.

The voltage converting circuit 22 includes P-channel transistors 201, 202, and N-channel transistors 203, 205. Sources of the P-channel transistors 201, 202 are connected to a second power supply which supplies the high power supply voltage VDD3. Drains of the P-channel transistors 201 and 202 are connected to nodes 207 and 208, respectively. A gate of the P-channel transistor 201 is connected to the node 208, and a gate of the P-channel transistor 202 is connected to the node 207. In other words, the P-channel transistor 201 and the P-channel transistor 202 are cross-coupled. Also, sources of the N-channel transistors 203, 205 are connected to the ground. A drain of the N-channel transistor 203 is connected to the node 207 and hence to the gate of the P-channel transistor 202. A drain of the N-channel transistor 205 is connected to the node 208 and hence to the gate of the P-channel transistor 201. A gate of the N-channel transistor 203 is connected to the input terminal In, and the input signal to the level shifter is applied to the gate of the N-channel transistor 203. A gate of the N-channel transistor 205 is connected to the output of the inverter 21, and the inversion signal is applied to the gate of the N-channel transistor 205. The node 208 is connected to an output of the voltage converting circuit 22. Due to the voltage converting circuit 22, the signal level of the input signal inputted to the input terminal In is converted to match the high power supply voltage level VDD3, and the level-shifted signal is outputted from the node 208 to the buffer 24.

The buffer 24 is connected between the output of the voltage converting circuit 22 and an output terminal Out of the level shifter. The buffer 24 includes two-stage inverter, and the high power supply voltage VDD3 is supplied to the two-stage inverter. The level-shifted signal is outputted from the output terminal Out as an output signal.

When the low and high power supply voltages VDD2 and VDD3 are normally supplied, complementary signals are applied to the respective gates of the N-channel transistors 203 and 205. Also, signal levels at the nodes 207 and 208 are determined.

For example, when the signal level of the input signal is High (2.5 V), the N-channel transistor 203 is turned ON, while the N-channel transistor 205 is turned OFF. Thus, the voltage level of the node 207 is changed to Low, and the voltage level of the node 208 is changed to High. The P-channel transistor 202 whose gate is connected to the node 207 is turned ON, while the P-channel transistor 201 whose gate is connected to the node 208 is turned OFF. Thus, the voltage level of the node 208 is settled to High (3.3 V). The voltage level of the node 208 is transmitted through the buffer 24 to the output terminal Out. As a result, the signal level of the High signal (2.5 V) inputted to the input terminal In is converted to 3.3 V, and the High signal (3.3 V) is outputted from the output terminal Out. As described above, the circuit shown in FIG. 2 functions as a level shifter as a whole. When the signal level of the input signal is Low (0 V), a Low signal (0 V) is outputted from the output terminal Out due to a similar operation.

Here, let us consider a situation when the first power supply is turned OFF and only the second power supply is turned ON. In this case, the low power supply voltage VDD2 is 0 V, although the high power supply voltage VDD3 is 3.3 V. Such a situation can occur for a short time (in an order of msec) and over a long time, when a system is powered on, a multi power supply circuit is used, the system is failed, and so on.

When the first power supply is turned OFF and the low power supply voltage VDD2 is 0 V, a signal from a circuit system depending on the first power supply become 0V or a low level close to 0V. In the circuit shown in FIG. 2, the voltage levels of the gates of the N-channel transistors 203 and 205 become Low, and both of the N-channel transistors 203 and 205 are turned OFF. In this case, the voltage level of the node 207 is High or High Impedance, which is unstable. Also, the voltage level of the node 208 is High or High Impedance, which is unstable. Thus, the signal level of the output signal outputted from the output terminal Out is also unstable. When the level shifters 11, 12 shown in FIG. 1 are in such a status and the unstable output signals are inputted to the tri state buffer 13, some unexpected signals which are not assumed in a system designing may be outputted from the output terminal D_out to the outside of the LSI chip. Such unexpected signals can cause unexpected system failure.

In order to solve such a problem, Japanese Laid Open Patent Application (JP-P2001-144600A) discloses another level shifter, in which drop in the low power supply voltage VDD2 (inner voltage) is sensed, and the status of the level shifter is reset to stabilize the voltage level of the output terminal Out.

Figure 3:
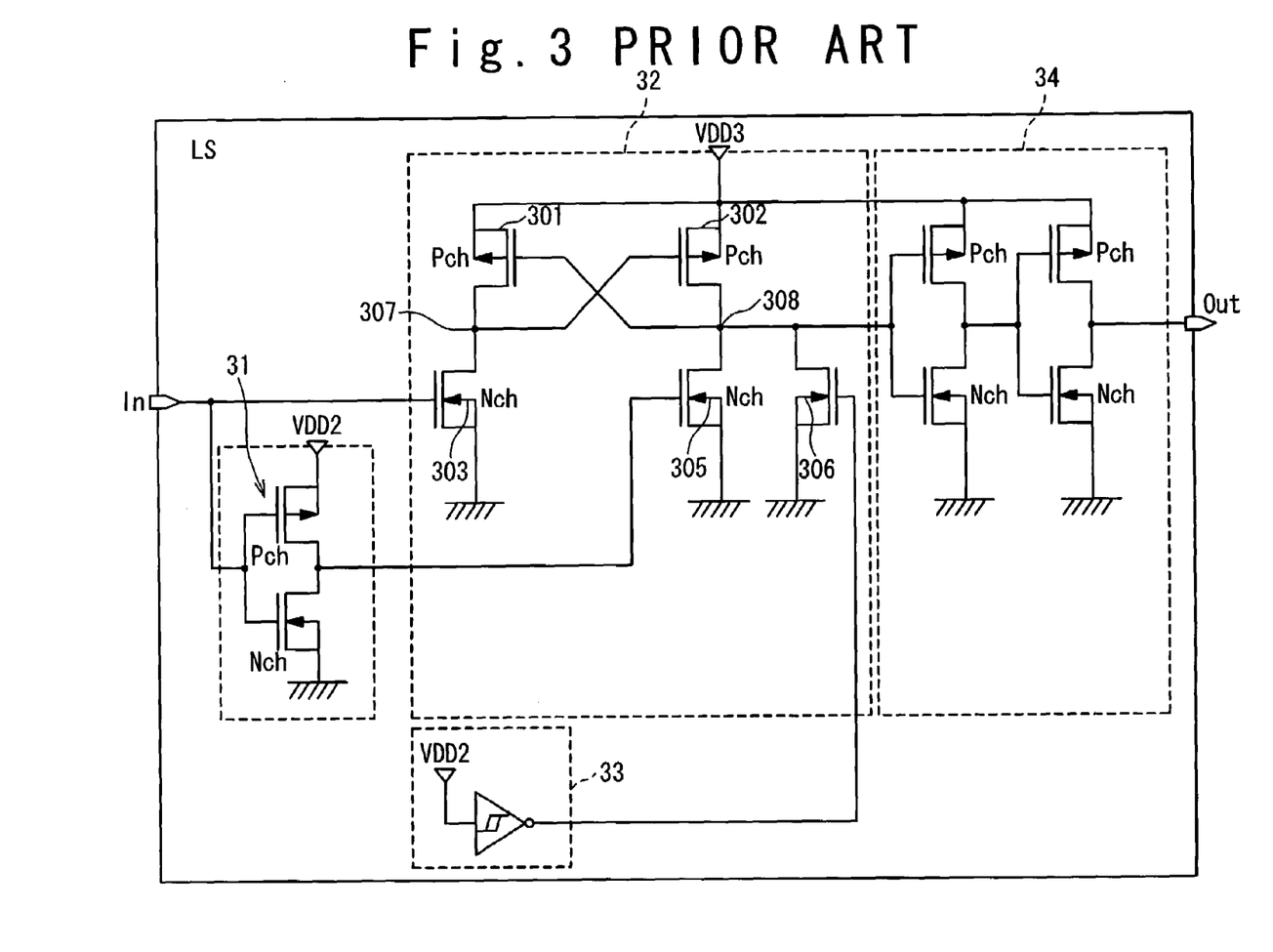
FIG. 3 is a circuit diagram showing a configuration of another level shifter according to another conventional technique.

FIG. 3 is a circuit diagram showing a configuration of the level shifter according to the conventional technique disclosed in the above-mentioned patent document (JP-P2001-144600A). As shown in FIG. 3, the level shifter (LS) has an inverter 31, a voltage converting circuit 32, a Schmitt-Trigger inverter 33, and a buffer 34.

The inverter 31 is connected to an input terminal In of the level shifter. The low power supply voltage VDD2 is supplied from a first power supply to the inverter 31. The inverter 31 has a P-channel transistor and a N-channel transistor which are connected in series between the power supply VDD2 and the ground. The inverter 31 receives an input signal from the input terminal In, and inverts the input signal to generate an inversion signal.

The voltage converting circuit 32 includes P-channel transistors 301, 302, and N-channel transistors 303, 305 and 306. Sources of the P-channel transistors 301, 302 are connected to a second power supply which supplies the high power supply voltage VDD3.

Drains of the P-channel transistors 301 and 302 are connected to nodes 307 and 308, respectively. A gate of the P-channel transistor 301 is connected to the node 308, and a gate of the P-channel transistor 302 is connected to the node 307. In other words, the P-channel transistor 301 and the P-channel transistor 302 are cross-coupled. Also, sources of the N-channel transistors 303, 305 and 306 are connected to the ground. A drain of the N-channel transistor 303 is connected to the node 307 and hence to the gate of the P-channel transistor 302. Drains of the N-channel transistors 305 and 306 are connected to the node 308 and hence to the gate of the P-channel transistor 301. A gate of the N-channel transistor 303 is connected to the input terminal In, and the input signal to the level shifter is applied to the gate of the N-channel transistor 303. A gate of the N-channel transistor 305 is connected to the output of the inverter 31, and the inversion signal is applied to the gate of the N-channel transistor 305. A gate of the N-channel transistor 306 is connected to the output of the Schmitt-Trigger inverter 33. The node 308 is connected to an output of the voltage converting circuit 32.

The buffer 34 is connected between the output of the voltage converting circuit 32 and an output terminal Out of the level shifter. The buffer 34 includes two-stage inverter, and the high power supply voltage VDD3 is supplied to the two-stage inverter. The level-shifted signal is outputted from the output terminal Out as an output signal.

Figure 4:
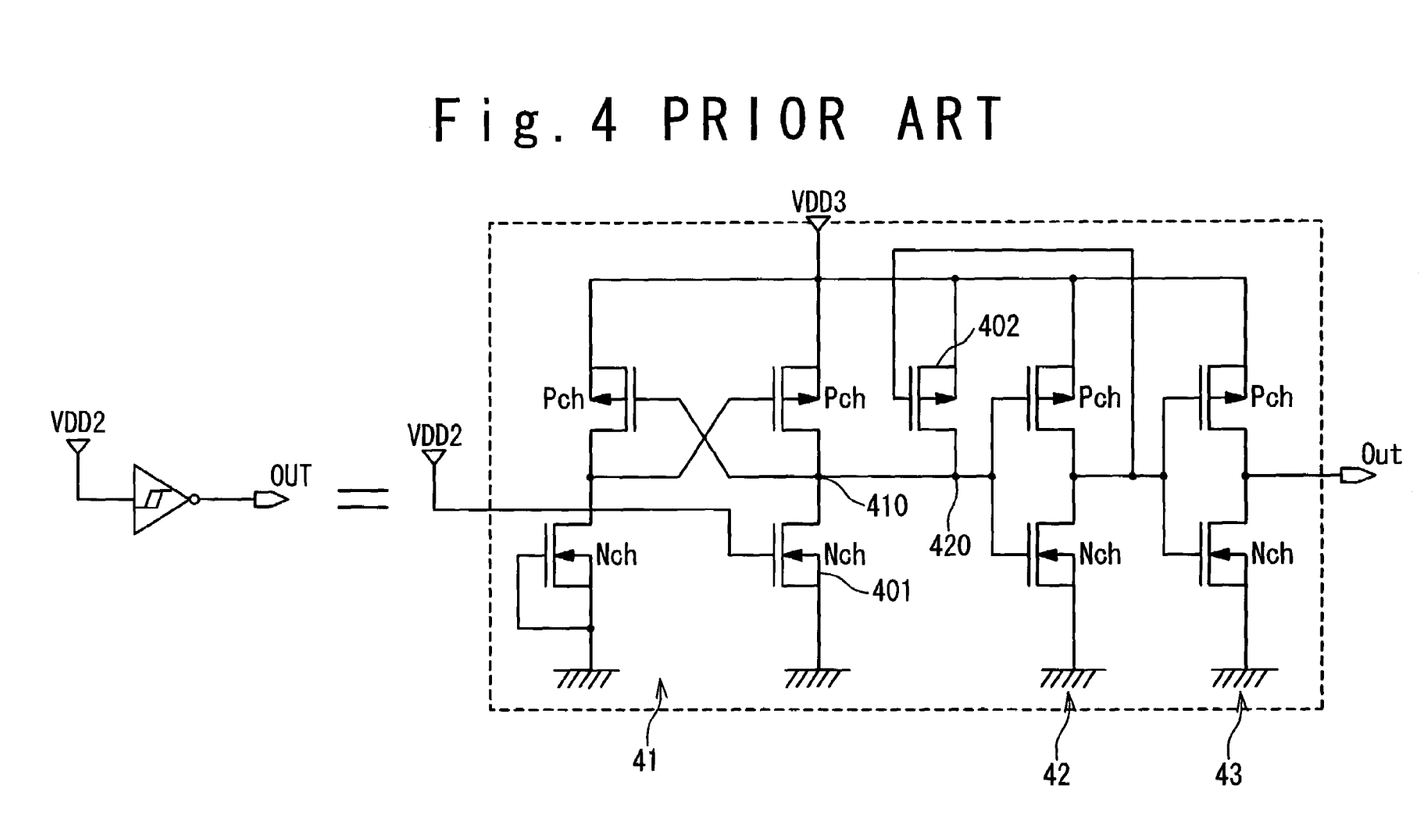
FIG. 4 is a circuit diagram showing a Schmitt-Trigger inverter used in the level shifter shown in FIG. 3.

FIG. 4 shows a configuration of the Schmitt-Trigger inverter 33 (refer to FIG. 2 in the above-mentioned patent document JP-P2001-144600A). The Schmitt-Trigger inverter 33 has a hysteresis characteristic. As shown in FIG. 4, the Schmitt-Trigger inverter 33 has a level shifter 41, inverters 42 and 43, and a P-channel transistor 402. Sources of P-channel transistors of the level shifter 41 are connected to the second power supply (VDD3). A gate of a N-channel transistor 401 of the level shifter 41 is connected to the first power supply (VDD2). A drain and source of the N-channel transistor 401 are connected to a node 410 and the ground, respectively. The node 410 is connected to an input of the inverter 42 through a node 420. An output of the inverter 42 is connected not only to an input of the inverter 43 but also to a gate of the P-channel transistor 402. A source of the P-channel transistor 402 is connected to the second power supply (VDD3). A drain of the P-channel transistor 402 is connected to the node 420, i.e., to the input of the inverter 42. An output of the inverter 43 is connected to an output terminal Out.

When the first power supply supplies the voltage VDD2 normally, the N-channel transistor 401 is turned ON and hence the voltage level of the node 410 is set to Low. Thus, a low level signal is outputted from the output terminal Out of the Schmitt-Trigger inverter 33. Next, let us consider a situation when the first power supply (VDD2) is turned OFF and only the second power supply (VDD3) is turned ON. Such a situation can occur, for example, when a system is powered on. In this case, the low power supply voltage VDD2 is 0 V, and the N-channel transistor 401 is turned OFF. At the time when the system is powered on, the gate voltages of the P-channel transistors of the level shifter 41 tend to be 0 V. Therefore, the P-channel transistors of the level shifter 41 are turned ON, and thus the voltage level of the node 410 begins to increase. Then, a N-channel transistor of the inverter 42 is turned ON at a certain timing, and the inverter 42 outputs a low level signal to the gate of the P-channel transistor 402. As a result, the P-channel transistor 402 is turned ON, and hence the voltage of the node 420 is determined to be the high power supply voltage VDD3. Therefore, a high level signal is outputted from the output terminal Out.

As described above, the Schmitt-Trigger inverter 33 outputs a low level signal (0 V) when the first power supply (VDD2) is switched on. On the other hand, the Schmitt-Trigger inverter 33 outputs a high level signal (3.3 V) when the first power supply (VDD2) is switched off. The low level signal and the high level signal are applied to the gate of the N-channel transistor 306 shown in FIG. 3. As described below, the N-channel transistor 306 plays a role of resetting the level shifter shown in FIG. 3.

Now referring to FIG. 3, when the low power supply voltage VDD2 is normally supplied, a low level signal is applied to the gate of the N-channel transistor 306 and the N-channel transistor 306 is turned OFF. From a view point of D.C., such a situation is equivalent to a situation where the N-channel transistor 306 does not exist. Therefore, the cross-coupled P-channel transistors 301 and 302, the N-channel transistors 303 and 305 connected to respective of the nodes 307 and 308, and the inverters 31 and 34 function as a level shifter as in FIG. 2.

On the other hand, when the first power 20 supply is turned OFF and the low power supply voltage VDD2 is 0 V, both of the N-channel transistors 303 and 305 are turned OFF. However, the Schmitt-Trigger inverter 33 outputs the high level signal (3.3 V) to the gate of the N-channel transistor 306, and hence the N-channel transistor 306 is turned ON. Therefore, the voltage level of the node 308 is determined to Low, and thus the voltage level of the output terminal Out of the level shifter is fixed to Low. According to the conventional art, as explained above, the signal level of the output signal outputted from the level shifter is fixed to Low when the low power supply voltage VDD2 is 0 V, which prevents the unstable and unexpected output signal.

SUMMARY OF THE INVENTION

The present invention has recognized the following points. That is to say, according to the conventional level shifter shown in FIG. 3, the voltage level of the output terminal Out is fixed to "Low" when the first power supply (VDD2) is cut off and the level shifter is reset.

When the level shifter is applied to the output buffer shown in FIG. 1 and the first power supply (VDD2) is OFF, the signal levels of the data signal and the enable signal inputted to the tri state buffer 13 are fixed to Low and thus the state of the output terminal D_out is fixed to "High Impedance". However, depending on the application of the LSI, there is also a need to fix the voltage level of the output terminal D_out to "Low" when the first power supply (VDD2) is OFF. In order to meet the requirement, it may be necessary to add a pull-down resister outside the LSI.

Also, in the application where an A.C. characteristic is treated as important, it is preferable to make transient properties of the level shifter consistent between in a case when the input signal changes from Low level to High level and in a case when the input signal changes from High level to Low level. In order to make the transient properties consistent, it is necessary to balance the parasitic capacitance of the transistors connected to the node 307 with that of the transistors connected to the node 308. However, according to the conventional level shifter shown in FIG. 3, the balance is lost due to the N-channel transistor 306 for use in reset of the level shifter.

According to the conventional technique, as mentioned above, there is a problem in that the reset status of the level shifter is limited and the A.C. characteristic as a level shifter is unbalanced.

In an aspect of the present invention, a level shifter has a voltage converting circuit configured to convert an input signal provided by a first power supply into an output signal provided by a second power supply, and a reset circuit configured to output a reset signal to the voltage converting circuit when the first power supply is turned off. The reset circuit includes an inverter whose input is connected to the first power supply, and a signal outputted from the inverter is supplied to the voltage converting circuit as the reset signal.

The voltage converting circuit has: a cross-coupled circuit including a first FET and a second FET which are cross-coupled and whose sources are connected to the second power supply; a first trigger FET connected to a gate of the second FET and configured to trigger the second FET in response to the input signal; a second trigger FET connected to the gate of the second FET in parallel with the first trigger FET; a third trigger FET connected to a gate of the first FET and configured to trigger the first FET in response to an inversion signal of the input signal; and a fourth trigger FET connected to the gate of the first FET in parallel with the third trigger FET. More specifically, a drain of the first FET and the gate of the second FET are connected to a first node. A drain of the second FET and the gate of the first FET are connected to a second node. Drains of the first trigger FET and the second trigger FET are connected to the first node. Drains of the third trigger FET and the fourth trigger FET are connected to the second node. Sources of the first to fourth trigger FETs are connected to a third power supply. The input signal is applied to a gate of the first trigger FET, and the inversion signal is applied to a gate of the third trigger FET. Also, the output signal is outputted from the second node.

As described above, the first node is connected to the first and the second trigger FETs, while the second node is connected to the third and the fourth trigger FETs. Therefore, the parasitic capacitance of the transistors connected to the first node is balanced with that of the transistors connected to the second node. As a result, the transient properties of the level shifter become consistent between in a case when the input signal changes from Low level to High level and in a case when the input signal changes from High level to Low level. In other words, it is possible according to the present invention to balance the A.C. characteristic.

Also, in the level shifter of the present invention, any of the second trigger FET and the fourth trigger FET triggers corresponding one of the second FET and the first FET in response to the reset signal.

For example, the reset signal can be applied to a gate of the second trigger FET when the first power supply is turned OFF. In this case, the second trigger FET triggers the second FET in response to the reset signal. As a result, the voltage level of the second node is fixed to "High", and the signal level of the output signal is fixed to "High" when the first power supply is turned OFF. Such a level shifter is referred to as "LS_H" hereinafter.

Also, the reset signal can be applied to a gate of the fourth trigger FET when the first power supply is turned OFF. In this case, the fourth trigger FET triggers the first FET in response to the reset signal. As a result, the voltage level of the second node is fixed to "Low", and the signal level of the output signal is fixed to "Low" when the first power supply is turned OFF. Such a level shifter is referred to as "LS_L" hereinafter.

According to the level shifter of the present invention, as described above, the voltage level of the output signal is not limited and can be easily set to any of "High" and "Low". By combining the "LS_H" and the "LS_L", a variety of buffer circuits can be achieved as described below.

A buffer circuit according to the present invention includes a tri state buffer, a first level shifter connected to the tri state buffer, and a second level shifter connected to the tri state buffer. The first level shifter outputs the output signal as a data signal to the tri state buffer, and the second level shifter outputs the output signal as an enable signal to the tri state buffer. When enabled by the enable signal, the tri state buffer receives the data signal and outputs the data signal.

Here, the first level shifter can be the "LS_L", and the second level shifter can be the "LS_H". In this case, the output of the buffer circuit is fixed to "Low" when the first power supply is turned OFF and the level shifters are reset.

Also, both of the first and the second level shifters can be the "LS_L". In this case, the output of the buffer circuit is fixed to "High Impedance" when the first power supply is turned OFF and the level shifters are reset.

Also, a buffer circuit of the present invention may include: a NAND gate receiving a data signal and an enable signal; a NOR gate receiving the data signal and an inversion signal of the enable signal; a P-channel transistor whose drain is connected to an output terminal; an N-channel transistor whose drain is connected to the output terminal; a first level shifter whose input and output are connected to an output of the NAND gate and a gate of the P-channel transistor, respectively; and a second level shifter whose input and output are connected to an output of the NOR gate and a gate of the N-channel transistor, respectively. The first level shifter receives the input signal from the NAND gate and outputs the output signal to the gate of P-channel transistor, and the second level shifter receives the input signal from the NOR gate and outputs the output signal to the gate of N-channel transistor. Both of the first and the second level shifters are the "LS_L". In this case, the output of the buffer circuit is fixed to "High" when the first power supply is turned OFF and the level shifters are reset.

According to the present invention, the level shifters LS_L and LS_H have the same electric functions, electric properties, sizes and appearances at the time of the normal operation when the power is normally supplied. However, when the first power supply is turned OFF, the respective output terminals are fixed to the different statuses. An LSI designer can arrange terminals without any constraint when considering an LSI floor plan, and also can set the respective terminals to be intended statuses at the time of unusual power supply.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 5:
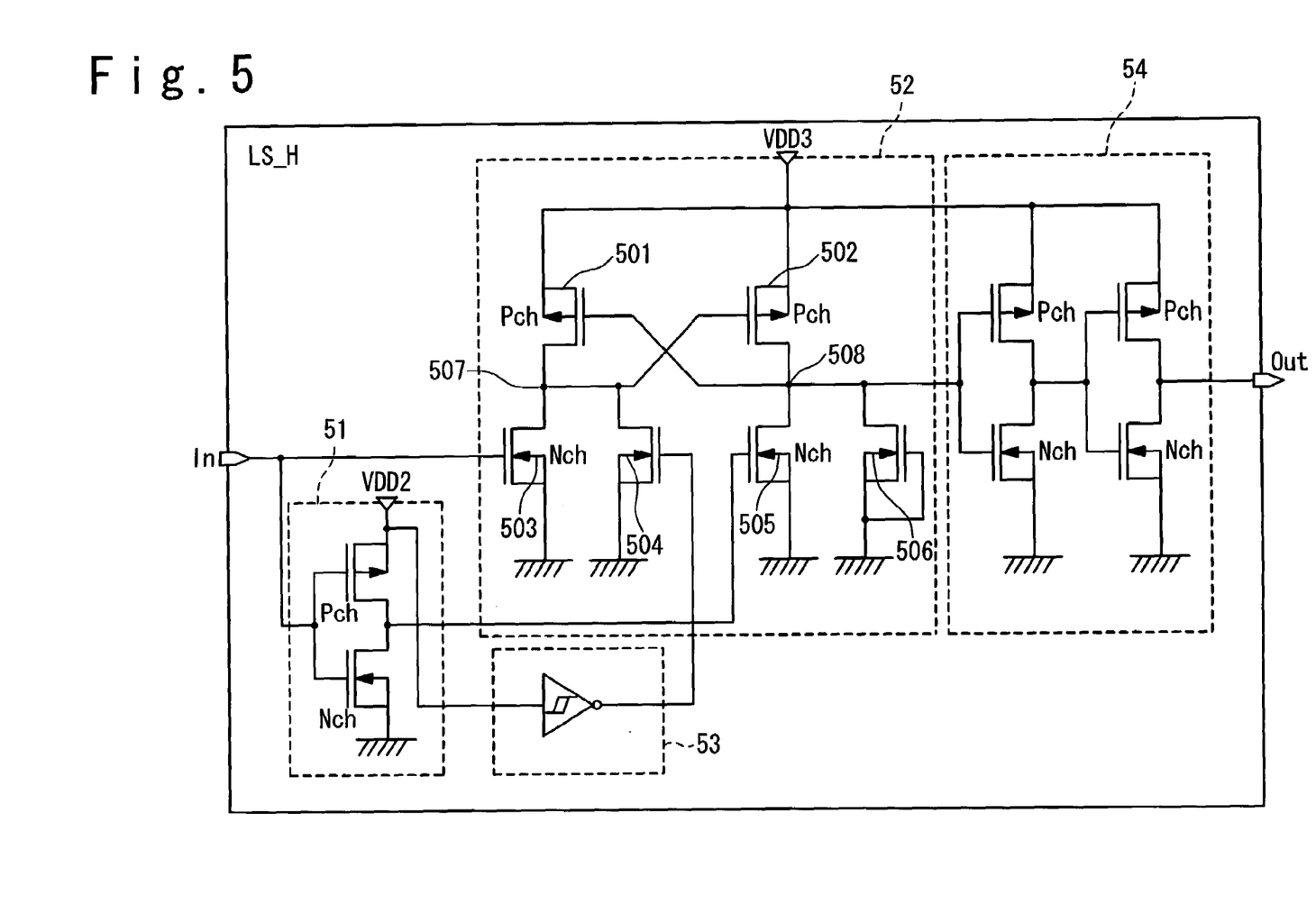
FIG. 5 is a circuit diagram showing a configuration of a level shifter according to a first embodiment of the present invention.

FIG. 5 is a circuit diagram showing a configuration of a level shifter according to a first embodiment of the present invention. As shown in FIG. 5, the level shifter (LS_H) has an input terminal In, an output terminal Out, an inverter 51, a voltage converting circuit 52, a reset circuit 53, and a buffer 54.

An input signal is inputted to the input terminal In. The input signal is dependent on and provided by a "first power supply (VDD2)" which is an internal power supply and supplies an internal power supply voltage (low power supply voltage) VDD2. That is, the signal voltage of the High-level input signal is the low power supply voltage VDD2. An output signal is outputted from the output terminal Out. The output signal is dependent on and provided by a "second power supply (VDD3)" which is an external interface power supply and supplies an external interface power supply voltage (high power supply voltage) VDD3. That is, the signal voltage of the High-level output signal is the high power supply voltage VDD3. Here, the high power supply voltage VDD3 is higher than the low power supply voltage VDD2. The level shifter converts the input signal having a first voltage range GND-VDD2 into the output signal having a second voltage range GND-VDD3.

The inverter 51 is connected to the input terminal In of the level shifter. The low power supply voltage VDD2 is supplied from the first power supply to the inverter 51. The inverter 51 has a P-channel transistor and a N-channel transistor which are connected in series between the first power supply VDD2 and the ground. The inverter 51 receives the input signal from the input terminal In, and inverts the input signal to generate an inversion signal.

The voltage converting circuit 52 converts the input signal to the output signal. More specifically, the voltage converting circuit 52 includes P-channel transistors 501, 502, and N-channel transistors 503, 504, 505 and 506. Each of the transistors 501 to 506 is a MOSFET (Metal-Oxide-Semiconductor Field-Effect-Transistor). Sources of the P-channel transistors 501, 502 are connected to the second power supply (VDD3). Drains of the P-channel transistors 501 and 502 are connected to nodes 507 and 508, respectively. A gate of the P-channel transistor 501 is connected to the node 508, and a gate of the P-channel transistor 502 is connected to the node 507. In other words, the P-channel transistor 501 and the P-channel transistor 502 are cross-coupled and form a cross-coupled circuit.

Also, sources of the N-channel transistors 503, 504, 505 and 506 are connected to the ground. Drains of the N-channel transistors 503 and 504 are connected to the node 507 and hence to the gate of the P-channel transistor 502. That is, the N-channel transistor 504 is connected to the gate of the P-channel transistor 502 in parallel with the N-channel transistor 503. Drains of the N-channel transistors 505 and 506 are connected to the node 508 and hence to the gate of the P-channel transistor 501. That is, the N-channel transistor 506 is connected to the gate of the P-channel transistor 501 in parallel with the N-channel transistor 505. A gate of the N-channel transistor 503 is connected to the input terminal In, and the input signal is applied to the gate of the N-channel transistor 503. Thus, the N-channel transistor 503 is a trigger FET which triggers the P-channel transistor 502 in response to the input signal. A gate of the N-channel transistor 504 is connected to an output of the reset circuit 53, and a reset signal outputted from the reset circuit 53 is applied to the gate of the N-channel transistor 504. Thus, the N-channel transistor 504 is a trigger FET which triggers the P-channel transistor 502 in response to the reset signal. A gate of the N-channel transistor 505 is connected to the output of the inverter 51, and the inversion signal is applied to the gate of the N-channel transistor 505. Thus, the N-channel transistor 505 is a trigger FET which triggers the P-channel transistor 501 in response to the inversion signal. A gate of the N-channel transistor 506 is connected to the ground. The node 508 is the output of the voltage converting circuit 52.

The reset circuit 53 senses the level of the low power supply voltage VDD2. When the first power supply (VDD2) is turned OFF, the reset circuit 53 outputs a rest signal to the voltage converting circuit 52. More specifically, the reset circuit 53 includes a Schmitt-Trigger inverter. An input of the Schmitt-Trigger inverter is connected to the first power supply (VDD2), and an output thereof is connected to the gate of the N-channel transistor 504. The Schmitt-Trigger inverter has the same configuration as the conventional one shown in FIG. 4. That is to say, the Schmitt-Trigger inverter outputs a low level signal when the first power supply (VDD2) is switched on. On the other hand, the Schmitt-Trigger inverter outputs a high level signal when the first power supply (VDD2) is switched off. The low level signal and the high level signal are applied as the reset signal to the gate of the N-channel transistor 504. The N-channel transistor 504 plays a role of resetting the level shifter shown in FIG. 5.

The buffer 54 is connected between the output of the voltage converting circuit 52 and an output terminal Out of the level shifter. The buffer 54 includes two-stage inverter, and the high power supply voltage VDD3 is supplied to the two-stage inverter. The level-shifted signal is outputted from the output terminal Out as an output signal.

When the low power supply voltage VDD2 is normally supplied from the first power supply, the output of the reset circuit 53 is Low. As a result, the low level signal is applied to the gate of the N-channel transistor 504 and the N-channel transistor 504 is turned OFF. The gate of the N-channel transistor 506 having the same characteristics as the N-channel transistor 504 is connected to GND, and the N-channel transistor 506 is also turned OFF. In this case, the P-channel transistors 501 and 502 connected to respective of the nodes 507 and 508, the N-channel transistors 503 and 505 connected to respective of the nodes 507 and 508, and the inverter 51 for applying the inversion signal to the gate of the N-channel transistor 505 function and operate as a usual level shifter.

That is to say, when the low power supply voltage VDD2 is normally supplied from the first power supply and the signal level of the input signal is High (VDD2), the N-channel transistor 503 is turned ON. Thus, the voltage level of the first node 507 is set to Low, and the P-channel transistor 502 is turned ON. The signal level of the inversion signal is Low, and the N-channel transistor 505 is turned OFF. The voltage level of the second node 508 is set to High (VDD3), and the P-channel transistor 501 is turned OFF. As a result, the voltage level of the output terminal Out becomes High, and the output signal of high level (VDD3) is outputted.

When the signal level of the input signal is Low, the N-channel transistor 503 is turned OFF. The signal level of the inversion signal is High, and the N-channel transistor 505 is turned ON. Thus, the voltage level of the second node 508 is set to Low, and the P-channel transistor 501 is turned ON. The voltage level of the first node 507 is set to High, and the P-channel transistor 502 is turned OFF. As a result, the voltage level of the output terminal Out becomes Low, and the output signal of low level is outputted.

As described above, the first node 507 is connected to the N-channel transistors 503 and 504, while the second node 508 is connected to the N-channel transistors 505 and 506. The numbers of the transistors connected to respective of the first and the second nodes 507 and 508 are equal, except the input section of the next stage buffer 54. Thus, the A.C. characteristics (the parasitic capacitance and the like) of the level shifter are balanced. The transient properties of the level shifter become consistent between in a case when the input signal changes from Low level to High level and in a case when the input signal changes from High level to Low level. Moreover, when the low power supply voltage VDD2 is normally supplied and the level shifter operates normally, both of the N-channel transistors 504 and 506 are turned OFF. Thus, the D.C. characteristics (the leak current and the like) of the level shifter are balanced. It should be noted that an input capacitance of the next stage buffer 54 is micro as compared with another drain capacitance, and a dummy gate may be connected to the first node 507 as appropriate.

Next, let us consider a situation when the first power supply (VDD2) is turned OFF and only the second power supply (VDD3) is turned ON. Such a situation can occur, for example, when a system is powered on. In this case, the low power supply voltage VDD2 is 0 V, and both of the N-channel transistors 503 and 505 are turned OFF. However, the reset circuit 53 outputs the reset signal of the high level (VDD3) to the gate of the N-channel transistor 504, and hence the N-channel transistor 504 is turned ON. Therefore, the voltage level of the node 507 is determined to Low, and the P-channel transistor 502 is turned ON. In other words, the N-channel transistor 504 triggers the P-channel transistor 502. As a result, the voltage level of the node 508 is fixed to High, and thus the voltage level of the output terminal Out is fixed to "High".

According to the first embodiment, as explained above, the signal level of the output signal outputted from the level shifter is fixed to "High" when the low power supply voltage VDD2 is 0 V, which prevents the unstable and unexpected output signal. The level shifter according to the first embodiment shown in FIG. 5 may be referred to as "LS_H", hereinafter.

Second Embodiment

Figure 6:
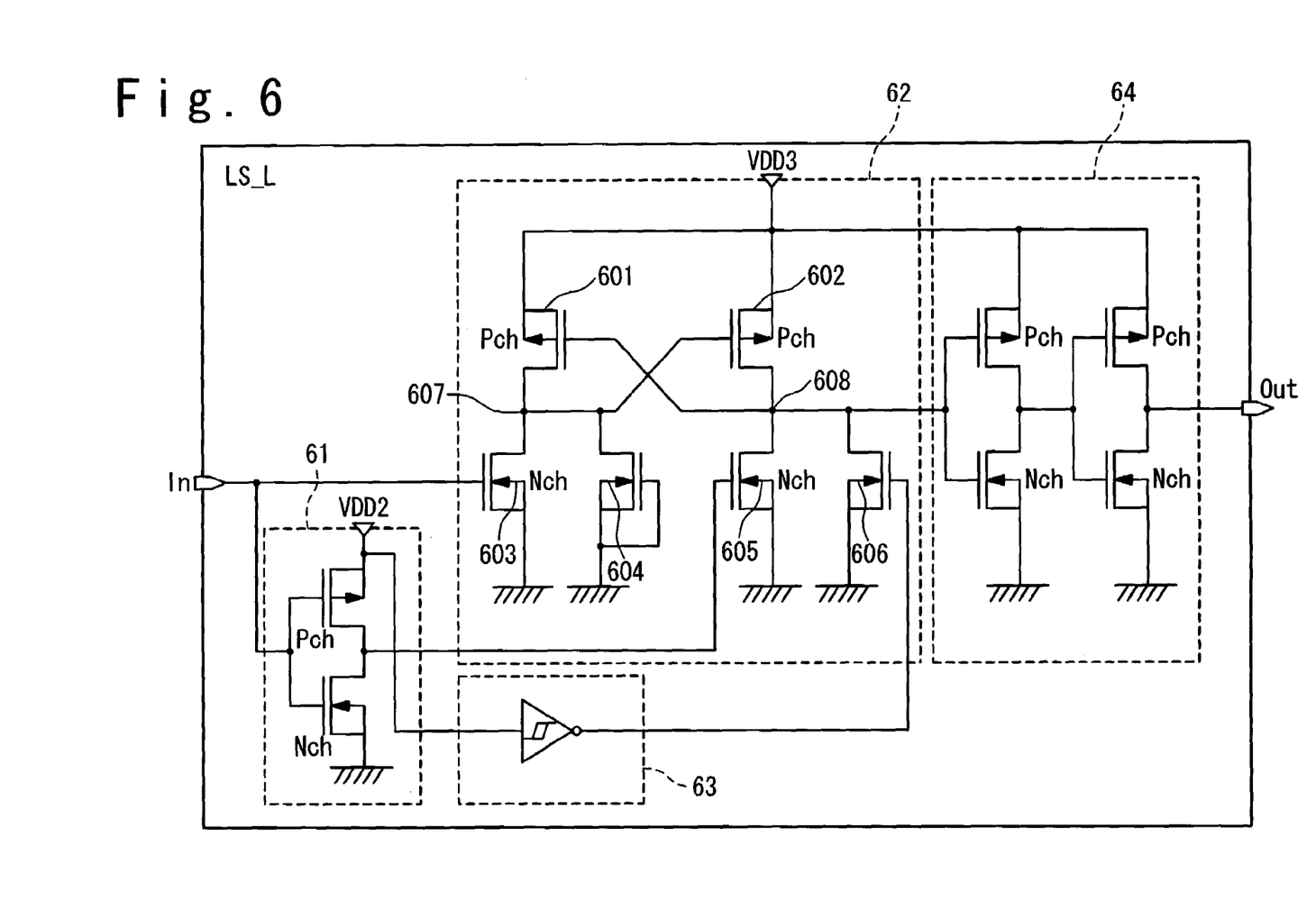
FIG. 6 is a circuit diagram showing a configuration of a level shifter according to a second embodiment of the present invention.

FIG. 6 is a circuit diagram showing a configuration of a level shifter according to a second embodiment of the present invention. As shown in FIG. 6, the level shifter (LS_L) has the input terminal In, the output terminal Out, an inverter 61, a voltage converting circuit 62, a reset circuit 63, and a buffer 64.

The inverter 61 is connected to the input terminal In of the level shifter. The low power supply voltage VDD2 is supplied from the first power supply to the inverter 61. The inverter 61 has a P-channel transistor and a N-channel transistor which are connected in series between the first power supply VDD2 and the ground. The inverter 61 receives the input signal from the input terminal In, and inverts the input signal to generate an inversion signal.

The voltage converting circuit 62 converts the input signal to the output signal. More specifically, the voltage converting circuit 62 includes P-channel transistors 601, 602, and N-channel transistors 603, 604, 605 and 606. Each of the transistors 601 to 606 is a MOSFET. Sources of the P-channel transistors 601, 602 are connected to the second power supply (VDD3). Drains of the P-channel transistors 601 and 602 are connected to nodes 607 and 608, respectively. A gate of the P-channel transistor 601 is connected to the node 608, and a gate of the P-channel transistor 602 is connected to the node 607. In other words, the P-channel transistor 601 and the P-channel transistor 602 are cross-coupled and form a cross-coupled circuit.

Also, sources of the N-channel transistors 603, 604, 605 and 606 are connected to the ground. Drains of the N-channel transistors 603 and 604 are connected to the node 607 and hence to the gate of the P-channel transistor 602. That is, the N-channel transistor 604 is connected to the gate of the P-channel transistor 602 in parallel with the N-channel transistor 603. Drains of the N-channel transistors 605 and 606 are connected to the node 608 and hence to the gate of the P-channel transistor 601. That is, the N-channel transistor 606 is connected to the gate of the P-channel transistor 601 in parallel with the N-channel transistor 605. A gate of the N-channel transistor 603 is connected to the input terminal In, and the input signal is applied to the gate of the N-channel transistor 603. Thus, the N-channel transistor 603 is a trigger FET which triggers the P-channel transistor 602 in response to the input signal. A gate of the N-channel transistor 604 is connected to the ground. A gate of the N-channel transistor 605 is connected to the output of the inverter 61, and the inversion signal is applied to the gate of the N-channel transistor 605. Thus, the N-channel transistor 605 is a trigger FET which triggers the P-channel transistor 601 in response to the inversion signal. A gate of the N-channel transistor 606 is connected to an output of the reset circuit 63, and a reset signal outputted from the reset circuit 63 is applied to the gate of the N-channel transistor 606. Thus, the N-channel transistor 606 is a trigger FET which triggers the P-channel transistor 601 in response to the reset signal. The node 608 is the output of the voltage converting circuit 62.

The reset circuit 63 senses the level of the low power supply voltage VDD2. When the first power supply (VDD2) is turned OFF, the reset circuit 63 outputs a rest signal to the voltage converting circuit 62. More specifically, the reset circuit 63 includes a Schmitt-Trigger inverter. An input of the Schmitt-Trigger inverter is connected to the first power supply (VDD2), and an output thereof is connected to the gate of the N-channel transistor 606. The Schmitt-Trigger inverter has the same configuration as the conventional one shown in FIG. 4. That is to say, the Schmitt-Trigger inverter outputs a low level signal when the first power supply (VDD2) is switched on. On the other hand, the Schmitt-Trigger inverter outputs a high level signal when the first power supply (VDD2) is switched off. The low level signal and the high level signal are applied as the reset signal to the gate of the N-channel transistor 606. The N-channel transistor 606 plays a role of resetting the level shifter shown in FIG. 6.

The buffer 64 is connected between the output of the voltage converting circuit 62 and an output terminal Out of the level shifter. The buffer 64 includes two-stage inverter, and the high power supply voltage VDD3 is supplied to the two-stage inverter. The level-shifted signal is outputted from the output terminal Out as an output signal.

When the low power supply voltage VDD2 is normally supplied from the first power supply, the output of the reset circuit 63 is Low. As a result, the low level signal is applied to the gate of the N-channel transistor 606 and the N-channel transistor 606 is turned OFF. The gate of the N-channel transistor 604 having the same characteristics as the N-channel transistor 606 is connected to GND, and the N-channel transistor 604 is also turned OFF. In this case, the P-channel transistors 601 and 602 connected to respective of the nodes 607 and 608, the N-channel transistors 603 and 605 connected to respective of the nodes 607 and 608, and the inverter 61 for applying the inversion signal to the gate of the N-channel transistor 605 function and operate as a usual level shifter.

That is to say, when the low power supply voltage VDD2 is normally supplied from the first power supply and the signal level of the input signal is High (VDD2), the N-channel transistor 603 is turned ON. Thus, the voltage level of the first node 607 is set to Low, and the P-channel transistor 602 is turned ON. The signal level of the inversion signal is Low, and the N-channel transistor 605 is turned OFF. The voltage level of the second node 608 is set to High (VDD3), and the P-channel transistor 601 is turned OFF. As a result, the voltage level of the output terminal Out becomes High, and the output signal of high level (VDD3) is outputted.

When the signal level of the input signal is Low, the N-channel transistor 603 is turned OFF. The signal level of the inversion signal is High, and the N-channel transistor 605 is turned ON. Thus, the voltage level of the second node 608 is set to Low, and the P-channel transistor 601 is turned ON. The voltage level of the first node 607 is set to High, and the P-channel transistor 602 is turned OFF. As a result, the voltage level of the output terminal Out becomes Low, and the output signal of low level is outputted.

As described above, the first node 607 is connected to the N-channel transistors 603 and 604, while the second node 608 is connected to the N-channel transistors 605 and 606. The numbers of the transistors connected to respective of the first and the second nodes 607 and 608 are equal, except the input section of the next stage buffer 64. Thus, the A.C. characteristics (the parasitic capacitance and the like) of the level shifter are balanced. The transient properties of the level shifter become consistent between in a case when the input signal changes from Low level to High level and in a case when the input signal changes from High level to Low level. Moreover, when the low power supply voltage VDD2 is normally supplied and the level shifter operates normally, both of the N-channel transistors 604 and 606 are turned OFF. Thus, the D.C. characteristics (the leak current and the like) of the level shifter are balanced. It should be noted that an input capacitance of the next stage buffer 64 is micro as compared with another drain capacitance, and a dummy gate may be connected to the first node 607 as appropriate.

Next, let us consider a situation when the first power supply (VDD2) is turned OFF and only the second power supply (VDD3) is turned ON. Such a situation can occur, for example, when a system is powered on. In this case, the low power supply voltage VDD2 is 0 V, and both of the N-channel transistors 603 and 605 are turned OFF. However, the reset circuit 63 outputs the reset signal of the high level (VDD3) to the gate of the N-channel transistor 606, and hence the N-channel transistor 606 is turned ON. Therefore, the voltage level of the node 608 is determined to Low. In other words, the N-channel transistor 606 triggers the P-channel transistor 601. As a result, the voltage level of the output terminal Out is fixed to "Low".

According to the second embodiment, as explained above, the signal level of the output signal outputted from the level shifter is fixed to "Low" when the low power supply voltage VDD2 is 0 V, which prevents the unstable and unexpected output signal. The level shifter according to the second embodiment shown in FIG. 6 may be referred to as "LS_L", hereinafter.

When comparing the level shifter LS_H according to the first embodiment and the level shifter LS_L according to the second embodiment, the N-channel transistors 504, 506, 604 and 606 are turned OFF when the low power supply voltage VDD2 is normally supplied from the first power supply. Therefore, the level shifter LS_H and the level shifter LS_L have the same characteristics and function in the same manner, when the power supply voltages VDD2 and VDD3 are supplied normally. On the other hand, when the first power supply (VDD2) is turned off, the level shifter LS_H and the level shifter LS_L output the different output signals having different output levels. As described above, the level shifters LS_L and LS_H have the same electric functions, electric properties, sizes and appearances at the time of the normal operation. However, when the first power supply is turned OFF, the respective output terminals are fixed to the different statuses. An LSI designer can arrange terminals without any constraint when considering an LSI floor plan.

It should be noted that the level shifter LS_L shown in FIG. 6 can be easily attained only by connecting the gate of the N-channel transistor 504 of the level shifter LS_H shown in FIG. 5 to the ground and by connecting the output of the reset circuit 53 to the gate of the N-channel transistor 506 of the level shifter LS_H. On the contrary, the level shifter LS_H shown in FIG. 5 can be easily attained only by connecting the gate of the N-channel transistor 606 of the level shifter LS_L shown in FIG. 6 to the ground and by connecting the output of the reset circuit 63 to the gate of the N-channel transistor 604 of the level shifter LS_L. In this way, the level shifter LS_H can be changed to the level shifter LS_L, and the level shifter LS_L can be changed to the level shifter LS_H only by changing a part of interconnections without any change of elements included in the level shifter block.

As described above, the voltage level of the output signal is not limited and can be easily set to any of "High" and "Low". By combining the level shifter "LS_H" and the level shifter "LS_L", a variety of buffer circuits can be achieved as described below.

Third Embodiment

Figure 7A:
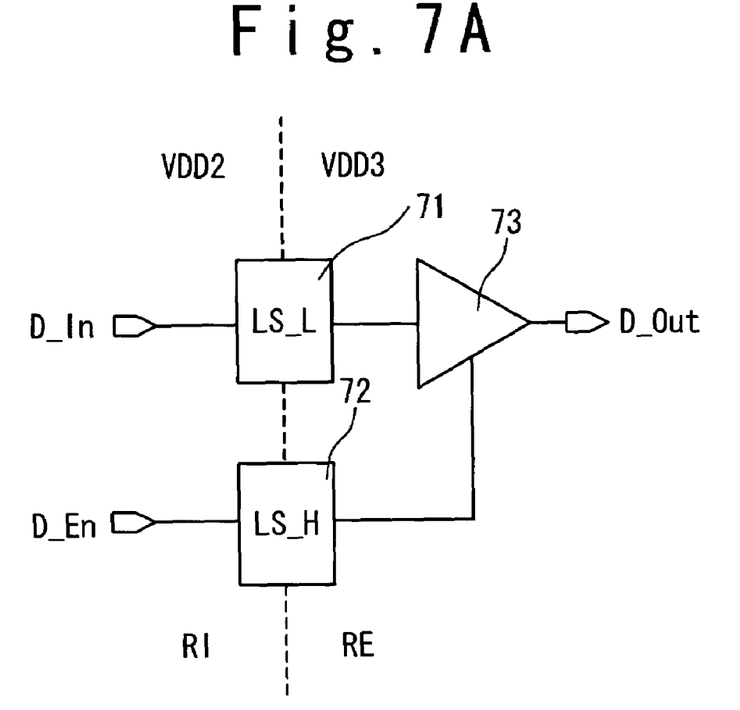
FIG. 7A is a circuit block diagram showing a buffer circuit using the level shifters of the present invention.

FIG. 7A is a circuit block diagram showing a configuration of a buffer circuit using the level shifter of the present invention.

A region RI corresponds to an LSI internal region to which the low power supply voltage VDD2 is provided, while a region RE corresponds to an LSI external interface region to which the high power supply voltage VDD3 is provided. The low power supply voltage VDD2 is an internal voltage and is supplied to internal circuits. On the other hand, the high power supply voltage VDD3 is an external interface voltage and is supplied to external interface circuits. For example, the low power supply voltage VDD2 is 2.5 V, and the high power supply voltage VDD3 is 3.3 V which is higher than the low power supply voltage VDD2.

The buffer circuit has a first level shifter 71, a second level shifter 72, and a tri state buffer 73. The tri state buffer 73 is provided in the region RE. The first level shifter 71 receives a data signal from a data input terminal D_In. The first level shifter 71 converts the signal level of the received data signal, and then outputs the level-shifted data signal to the tri state buffer 73. The second level shifter 72 receives an enable signal from an enable control input terminal D_En. The second level shifter 72 converts the signal level of the received enable signal, and then outputs the level-shifted enable signal to the tri state buffer 73. The enable signal is a signal for enabling the tri state buffer 73. When enabled by the enable signal, the tri state buffer 73 outputs the data signal to an output terminal D_Out.

According to the present embodiment, the level shifter LS_L is used as the first level shifter 71, and the level shifter LS_H is used as the second level shifter 72. Therefore, when the first power supply (VDD2) is turned OFF, the data signal outputted from the first level shifter 71 is fixed to the "Low" level, and the enable signal outputted from the second level shifter 72 is fixed to the "High" level.

Figure 7B:
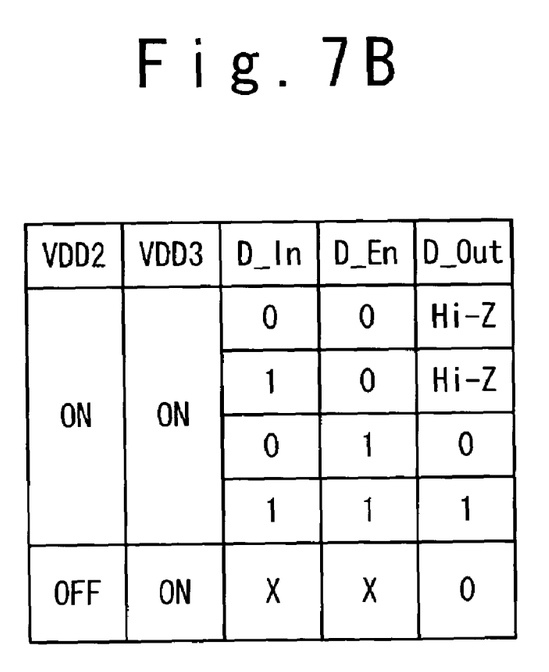
FIG. 7B is a truth table of the buffer circuit shown in FIG. 7A.

An output of the tri state buffer 73 is dependent on the data signal and the enable signal. That is, the output status of the tri state buffer 73 becomes any of High, Low, and High Impedance in accordance with the data signal and the enable signal. FIG. 7B is a truth table of the buffer circuit shown in FIG. 7A.

As shown in FIG. 7B, when the low and the high power supply voltages VDD2 and VDD3 are normally supplied, the buffer circuit shown in FIG. 7A operates in the same way as a normal tri state buffer. More specifically, when the signal level of the enable signal is Low (D_En: 0), the signal level of the output signal is High Impedance (D_Out: Hi-Z). When the signal levels of the data signal and the enable signal are Low and High, respectively (D_In: 0, D_En: 1), the signal level of the output signal is Low (D_Out: 0). When the signal levels of both the data signal and the enable signal are High (D_In: 1, D_En: 1), the signal level of the output signal is High (D_Out: 1).

When only the first power supply (VDD2) is turned OFF, the output of the first level shifter 71 (LS_L) is fixed to "Low", and the output of the second level shifter 72 (LS_H) is fixed to "High". Therefore, the signal level of the output signal of the buffer circuit is fixed to "Low" (D_Out: 0), irrespective of the statuses of terminals D_In and D_En. Since the status of the output terminal D_Out is fixed to "Low", it is possible to prevent the unexpected signals from being outputted from the output terminal D_Out. Thus, the unexpected system failure can be prevented.

Fourth Embodiment

Figure 8A:
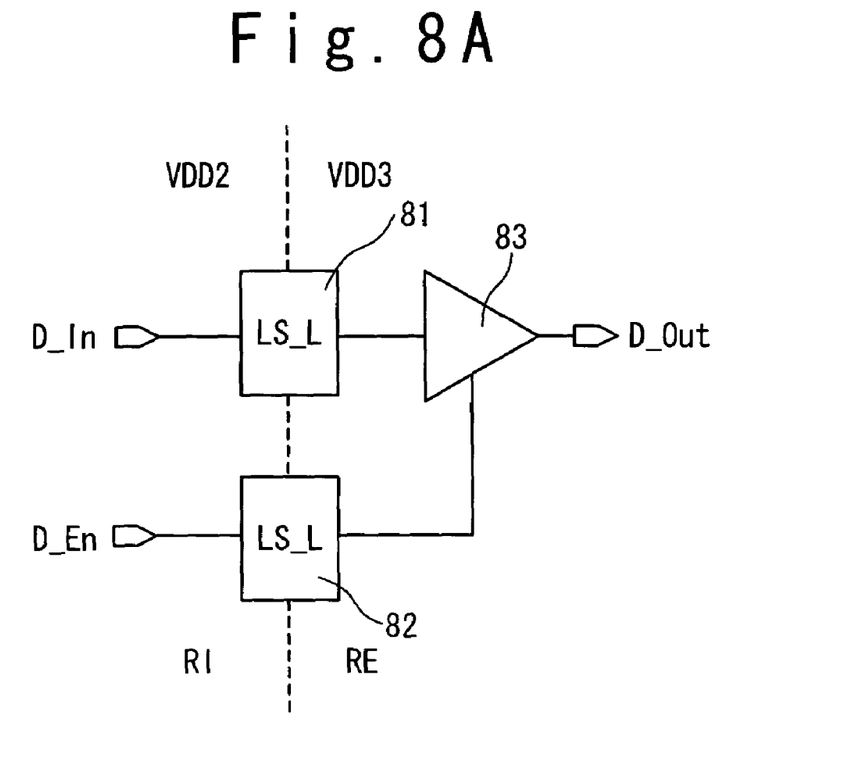
FIG. 8A is a circuit block diagram showing another buffer circuit using the level shifters of the present invention.

FIG. 8A is a circuit block diagram showing a configuration of a buffer circuit using the level shifter of the present invention. The buffer circuit has a first level shifter 81, a second level shifter 82, and a tri state buffer 83. The tri state buffer 83 is provided in the region RE. The first level shifter 81 receives a data signal from the data input terminal D_In. The first level shifter 81 converts the signal level of the received data signal, and then outputs the level-shifted data signal to the tri state buffer 83. The second level shifter 82 receives an enable signal from the enable control input terminal D_En. The second level shifter 82 converts the signal level of the received enable signal, and then outputs the level-shifted enable signal to the tri state buffer 83. When enabled by the enable signal, the tri state buffer 83 outputs the data signal to the output terminal D_Out.

According to the present embodiment, the level shifter LS_L is used as the first level shifter 81 and the second level shifter 82. Therefore, when the first power supply (VDD2) is turned OFF, the data signal outputted from the first level shifter 81 is fixed to the "Low" level, and the enable signal outputted from the second level shifter 82 is also fixed to the "Low" level.

Figure 8B:
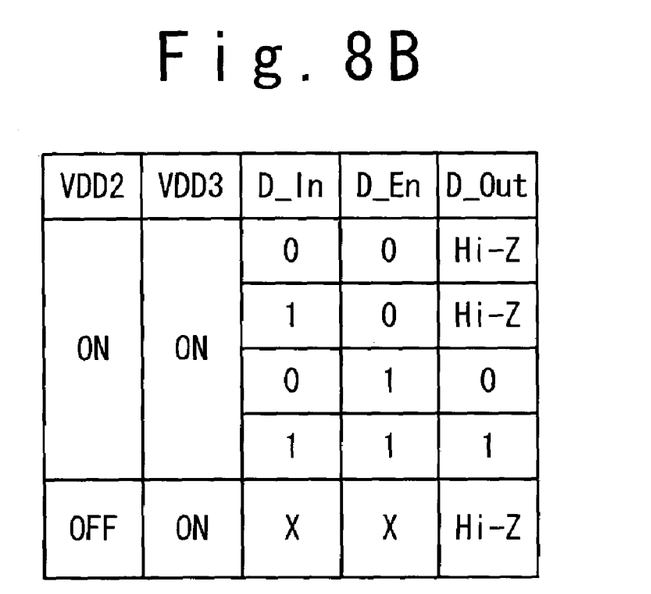
FIG. 8B is a truth table of the buffer circuit shown in FIG. 8A.

FIG. 8B is a truth table of the buffer circuit shown in FIG. 8A. As shown in FIG. 8B, when the low and the high power supply voltages VDD2 and VDD3 are normally supplied, the buffer circuit shown in FIG. 8A operates in the same way as a normal tri state buffer. More specifically, when the signal level of the enable signal is Low (D_En: 0), the signal level of the output signal is High Impedance (D_Out: Hi-Z). When the signal levels of the data signal and the enable signal are Low and High, respectively (D_In: 0, D_En: 1), the signal level of the output signal is Low (D_Out: 0). When the signal levels of both the data signal and the enable signal are High (D_In: 1, D_En: 1), the signal level of the output signal is High (D_Out: 1).

When only the first power supply (VDD2) is turned OFF, the output of the first level shifter 81 (LS_L) is fixed to "Low", and the output of the second level shifter 82 (LS_L) is fixed to "Low". Therefore, the signal level of the output signal of the buffer circuit is fixed to "High Impedance" (D_Out: Hi-Z), irrespective of the statuses of terminals D_In and D_En. Since the status of the output terminal D_Out is fixed to "High Impedance", it is possible to prevent the unexpected signals from being outputted from the output terminal D_Out. Thus, the unexpected system failure can be prevented. It should be noted that the level shifter LS_H may be used as the first level shifter 81.

Fifth Embodiment

Figure 9A:
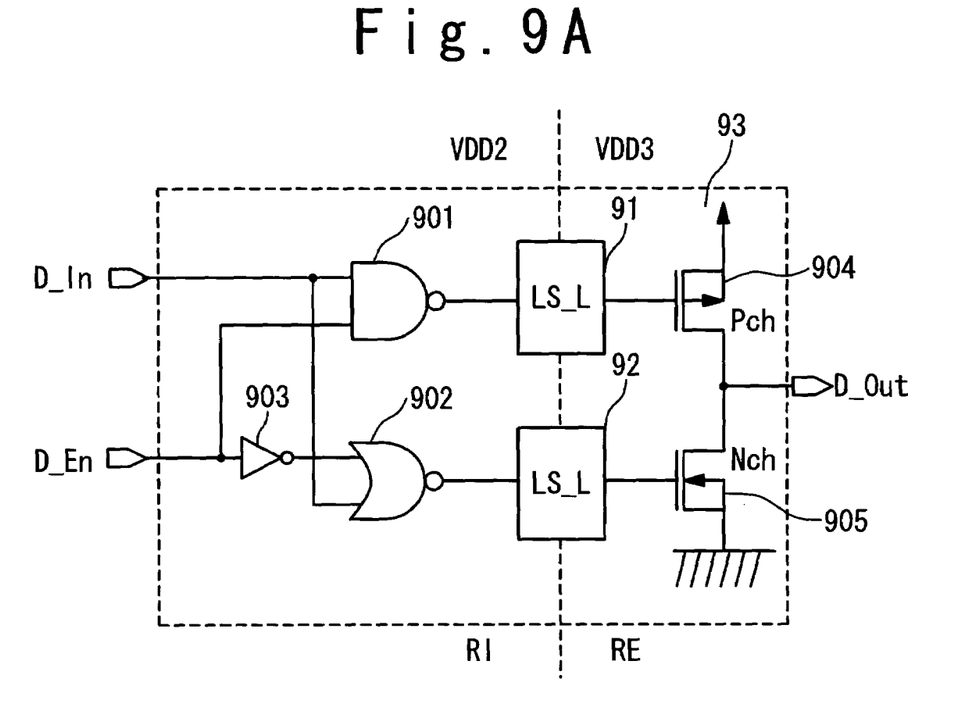
FIG. 9A is a circuit block diagram showing still another buffer circuit using the level shifters of the present invention.

FIG. 9A is a circuit block diagram showing a configuration of a buffer circuit 93 using the level shifter of the present invention. The buffer circuit 93 has a NAND gate 901, a NOR gate 902, an inverter 903, a P-channel transistor 904, an N-channel transistor 905, a first level shifter 91, and a second level shifter 92.

The NAND gate 901 receives the data signal from the input terminal D_In, and receives the enable signal from the enable control input terminal D_En. An input and an output of the inverter 903 are connected to the terminal D_En and an input of the NOR gate 902, respectively. The NOR gate 902 receives the data signal from the input terminal D_In, and receives an inversion signal of the enable signal from the inverter 903. An input and an output of the first level shifter 91 are connected to an output of the NAND gate 901 and a gate of the P-channel transistor 904, respectively. Also, an input and an output of the second level shifter 92 are connected to an output of the NOR gate 902 and a gate of the N-channel transistor 905, respectively. A source and a drain of the P-channel transistor 904 are connected to the second power supply (VDD3) and the output terminal D_Out, respectively. A source and a drain of the N-channel transistor 905 are connected to the ground GND and the output terminal D_Out, respectively.

According to the present embodiment, the level shifter LS_L is used as the first level shifter 91 and the second level shifter 92. Therefore, when the first power supply (VDD2) is turned OFF, the signal outputted from the first level shifter 91 is fixed to the "Low" level, and the signal outputted from the second level shifter 92 is also fixed to the "Low" level.

Figure 9B:
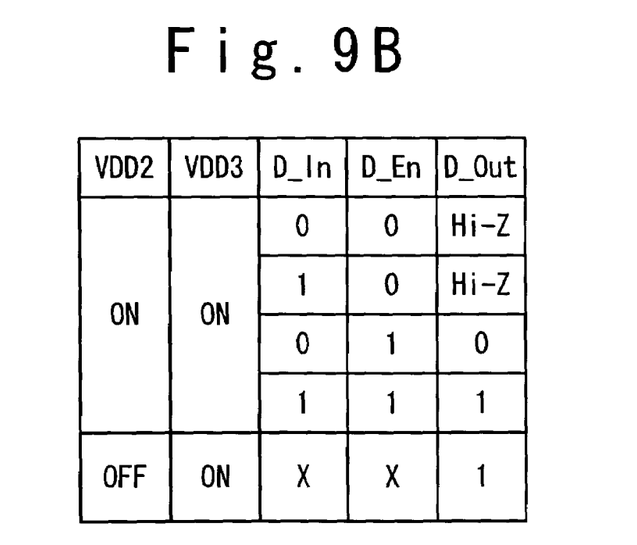
FIG. 9B is a truth table of the buffer circuit shown in FIG. 9A.

FIG. 9B is a truth table of the buffer circuit shown 93 in FIG. 9A. As shown in FIG. 9B, when the low and the high power supply voltages VDD2 and VDD3 are normally supplied, the buffer circuit 93 as a whole functions and operates as a normal tri state buffer. More specifically, when the signal level of the enable signal is Low (D_En: 0), the signal level of the output signal is High Impedance (D_Out: Hi-Z). When the signal levels of the data signal and the enable signal are Low and High, respectively (D_In: 0, D_En: 1), the signal level of the output signal is Low (D_Out: 0). When the signal levels of both the data signal and the enable signal are High (D_In: 1, D_En: 1), the signal level of the output signal is High (D_Out: 1).

When only the first power supply (VDD2) is turned OFF, the output of the first level shifter 91 (LS_L) is fixed to "Low", and the output of the second level shifter 92 (LS_L) is fixed to "Low". As a result, the P-channel transistor 904 is turned ON, and thus the signal level of the output signal of the buffer circuit 93 is fixed to "High" (D_Out: 1), irrespective of the statuses of terminals D_In and D_En. Since the status of the output terminal D_Out is fixed to "High", it is possible to prevent the unexpected signals from being outputted from the output terminal D_Out. Thus, the unexpected system failure can be prevented.

According to the present invention, as described above, the buffer circuits shown in FIGS. 7A, 8A and 9A operate in the same way when the power is supplied normally. However, when the first power supply (VDD2) is turned OFF, the output terminals D_out of the respective buffer circuits are fixed to the different statuses. In other words, the output status of the buffer circuit when the first power supply is OFF can be set to any of "High (1)", "Low (0)" and "High Impedance (Hi-Z)" by appropriately using the level shifters LS_H and LS_L. As mentioned above, replacing the level shifter LS_L (LS_H) by the level shifter LS_H (LS_L) can be carried out without difficulty by merely changing a part of interconnections, which is obvious from FIGS. 5 and 6.

It is apparent that the present invention is not limited to the above embodiment, and that may be modified and changed without departing from the scope and spirit of the invention.

What is claimed is:

1. A level shifter comprising:
a voltage converting circuit configured to convert an input signal provided by a first power supply into an output signal provided by a second power supply; and
a reset circuit configured to output a reset signal to said voltage converting circuit when said first power supply is turned off,
wherein said voltage converting circuit has:
a cross-coupled circuit including a first FET and a second FET which are cross-coupled and whose sources are connected to said second power supply;
a first trigger FET connected to a gate of said second FET and configured to trigger said second FET in response to said input signal;
a second trigger FET connected to said gate of said second FET in parallel with said first trigger FET;
a third trigger FET connected to a gate of said first FET and configured to trigger said first FET in response to an inversion signal of said input signal; and
a fourth trigger FET connected to said gate of said first FET in parallel with said third trigger FET,
wherein any of said second trigger FET and said fourth trigger FET triggers corresponding one of said second FET and said first FET in response to said reset signal.

2. The level shifter according to claim 1,
wherein said reset signal is applied to a gate of said second trigger FET, and said second trigger FET triggers said second FET in response to said reset signal.

3. The level shifter according to claim 1,
wherein said reset signal is applied to a gate of said fourth trigger FET, and said fourth trigger FET triggers said first FET in response to said reset signal.

4. The level shifter according to claim 1,
wherein said reset circuit includes an inverter whose input is connected to said first power supply, and a signal outputted from said inverter is supplied to said voltage converting circuit as said reset signal.

5. The level shifter according to claim 1,
wherein a drain of said first FET and said gate of said second FET are connected to a first node,
a drain of said second FET and said gate of said first FET are connected to a second node,
drains of said first trigger FET and said second trigger FET are connected to said first node,
drains of said third trigger FET and said fourth trigger FET are connected to said second node,
sources of said first to fourth trigger FETs are connected to a third power supply,
said input signal is applied to a gate of said first trigger FET,
said inversion signal is applied to a gate of said third trigger FET, and
said output signal is outputted from said second node.

6. The level shifter according to claim 5,
wherein said reset signal is applied to a gate of said second trigger FET to trigger said second trigger FET and said second FET.

7. The level shifter according to claim 5,
wherein said reset signal is applied to a gate of said fourth trigger FET to trigger said fourth trigger FET and said first FET.

8. A buffer circuit comprising:
a tri state buffer receiving a data signal and outputting said data signal when enabled by an enable signal;
a first level shifter connected to said tri state buffer; and
a second level shifter connected to said tri state buffer,
wherein each of said first level shifter and said second level shifter includes:
a voltage converting circuit configured to convert an input signal provided by a first power supply into an output signal provided by a second power supply; and
a reset circuit configured to output a reset signal to said voltage converting circuit when said first power supply is turned off,
wherein said voltage converting circuit has:
a cross-coupled circuit including a first FET and a second FET which are cross-coupled and whose sources are connected to said second power supply;
a first trigger FET connected to a gate of said second FET and configured to trigger said second FET in response to said input signal;
a second trigger FET connected to said gate of said second FET in parallel with said first trigger FET;
a third trigger FET connected to a gate of said first FET and configured to trigger said first FET in response to an inversion signal of said input signal; and
a fourth trigger FET connected to said gate of said first FET in parallel with said third trigger FET,
wherein any of said second trigger FET and said fourth trigger FET triggers corresponding one of said second FET and said first FET in response to said reset signal, and
wherein said first level shifter outputs said output signal as said data signal to said tri state buffer, and said second level shifter outputs said output signal as said enable signal to said tri state buffer.

9. The buffer circuit according to claim 8,
wherein in said first level shifter, said reset signal is applied to a gate of said fourth trigger FET and said fourth trigger FET triggers said first FET in response to said reset signal, and
in said second level shifter, said reset signal is applied to a gate of said second trigger FET and said second trigger FET triggers said second FET in response to said reset signal.

10. The buffer circuit according to claim 8,
wherein in each of said first level shifter and said second level shifter, said reset signal is applied to a gate of said fourth trigger FET and said fourth trigger FET triggers said first FET in response to said reset signal.

11. The buffer circuit according to claim 8,
wherein said reset circuit includes an inverter whose input is connected to said first power supply, and a signal outputted from said inverter is supplied to said voltage converting circuit as said reset signal.

12. The buffer circuit according to claim 8,
wherein a drain of said first FET and said gate of said second FET are connected to a first node,
a drain of said second FET and said gate of said first FET are connected to a second node,
drains of said first trigger FET and said second trigger FET are connected to said first node,
drains of said third trigger FET and said fourth trigger FET are connected to said second node,
sources of said first to fourth trigger FETs are connected to a third power supply,
said input signal is applied to a gate of said first trigger FET,
said inversion signal is applied to a gate of said third trigger FET, and
said output signal is outputted from said second node.

13. The buffer circuit according to claim 12,
wherein in said first level shifter, said reset signal is applied to a gate of said fourth trigger FET to trigger said fourth trigger FET and said first FET, and
in said second level shifter, said reset signal is applied to a gate of said second trigger FET to trigger said second trigger FET and said second FET.

14. The buffer circuit according to claim 12,
wherein in each of said first level shifter and said second level shifter, said reset signal is applied to a gate of said fourth trigger FET to trigger said fourth trigger FET and said first FET.

15. A buffer circuit comprising:
a NAND gate receiving a data signal and an enable signal;
a NOR gate receiving said data signal and an inversion signal of said enable signal;
a P-channel transistor whose drain is connected to an output terminal;
an N-channel transistor whose drain is connected to said output terminal;
a first level shifter whose input and output are connected to an output of said NAND gate and a gate of said P-channel transistor, respectively; and
a second level shifter whose input and output are connected to an output of said NOR gate and a gate of said N-channel transistor, respectively, wherein each of said first level shifter and said second level shifter includes:

a voltage converting circuit configured to convert an input signal provided by a first power supply into an output signal provided by a second power supply; and a reset circuit configured to output a reset signal to said voltage converting circuit when said first power supply is turned off, wherein said voltage converting circuit has:

a cross-coupled circuit including a first FET and a second FET which are cross-coupled and whose sources are connected to said second power supply;

a first trigger FET connected to a gate of said second FET and configured to trigger said second FET in response to said input signal;

a second trigger FET connected to said gate of said second FET in parallel with said first trigger FET;

a third trigger FET connected to a gate of said first FET and configured to trigger said first FET in response to an inversion signal of said input signal; and a fourth trigger FET connected to said gate of said first FET in parallel with said third trigger FET, wherein said reset signal is applied to a gate of said fourth trigger FET and said fourth trigger FET triggers said first FET in response to said reset signal, wherein said first level shifter receives said input signal from said NAND gate and outputs said output signal to said gate of P-channel transistor, and said second level shifter receives said input signal from said NOR gate and outputs said output signal to said gate of N-channel transistor.

16. The buffer circuit according to claim 15, wherein said reset circuit includes an inverter whose input is connected to said first power supply, and a signal outputted from said inverter is supplied to said voltage converting circuit as said reset signal.

17. The buffer circuit according to claim 15, wherein a drain of said first FET and said gate of said second FET are connected to a first node, a drain of said second FET and said gate of said first FET are connected to a second node, drains of said first trigger FET and said second trigger FET are connected to said first node, drains of said third trigger FET and said fourth trigger FET are connected to said second node, sources of said first to fourth trigger FETs are connected to a third power supply, said input signal is applied to a gate of said first trigger FET, said inversion signal is applied to a gate of said third trigger FET, said output signal is outputted from said second node, and said reset signal is applied to a gate of said fourth trigger FET to trigger said fourth trigger FET and said first FET.

* * * * *